United States Patent
Yang et al.

(10) Patent No.: US 11,742,447 B2
(45) Date of Patent: Aug. 29, 2023

(54) PHOTOVOLTAIC MODULE, SOLAR CELL, AND METHOD FOR PRODUCING SOLAR CELL

(71) Applicants: JINKO GREEN ENERGY (SHANGHAI) MANAGEMENT CO., LTD, Shanghai (CN); ZHEJIANG JINKO SOLAR CO., LTD, Zhejiang (CN)

(72) Inventors: Jie Yang, Shanghai (CN); Wenqi Li, Shanghai (CN); Xueting Yuan, Shanghai (CN); Xinyu Zhang, Shanghai (CN); Hao Jin, Shanghai (CN)

(73) Assignees: JINKO GREEN ENERGY (SHANGHAI) MANAGEMENT CO., LTD, Shanghai (CN); ZHEJIANG JINKO SOLAR CO., LTD, Zhejiang (CN)

( * ) Notice: Subject to any disclaimer, the term of this patent is extended or adjusted under 35 U.S.C. 154(b) by 281 days.

(21) Appl. No.: 17/197,912

(22) Filed: Mar. 10, 2021

(65) Prior Publication Data
US 2021/0376176 A1 Dec. 2, 2021

Related U.S. Application Data

(63) Continuation of application No. 16/901,143, filed on Jun. 15, 2020, now Pat. No. 10,991,838.

(30) Foreign Application Priority Data

May 29, 2020 (CN) .......................... 202010477787.6

(51) Int. Cl.
*H01L 31/054* (2014.01)
*H01L 31/048* (2014.01)
*H01L 31/18* (2006.01)

(52) U.S. Cl.
CPC ...... *H01L 31/0543* (2014.12); *H01L 31/0481* (2013.01); *H01L 31/1868* (2013.01); *Y02E 10/50* (2013.01)

(58) Field of Classification Search
None
See application file for complete search history.

(56) References Cited

U.S. PATENT DOCUMENTS

2001/0011761 A1    8/2001   Imoto
2001/0028100 A1   10/2001   Schmitz et al.
(Continued)

FOREIGN PATENT DOCUMENTS

CN    101611497    12/2009
CN    101964378     2/2011
(Continued)

OTHER PUBLICATIONS

Andrew Thomson et al., "Graded silicon nitride films: Optics and passivation", Journal of Vacuum Science & Technology A, 2015, vol. 33, pp. 060610-1-060610-5.
(Continued)

*Primary Examiner* — Eli S Mekhlin
(74) *Attorney, Agent, or Firm* — NIXON PEABODY LLP; Jeffrey L. Costellia (57) ABSTRACT

Provided is a solar cell. The solar cell may include a semiconductor layer and a passivation film stack provided on a back surface of the semiconductor layer. The passivation film stack may include a first passivation layer provided on the back surface of the semiconductor layer and including a silicon-rich layer with a silicon atom concentration ranging from $5 \times 10^{21}/cm^3$ to $2.5 \times 10^{22}/cm^3$; a second passivation layer provided on a surface of the first passivation layer and including an oxygen-rich and nitrogen-rich layer; and a third passivation layer provided on a surface of the second
(Continued)

passivation layer and including at least one silicon nitride film with a gradient-varied refractive index. A first refractive index of the first passivation layer may be greater than a second refractive index of the second passivation layer and smaller than a third refractive index of the third passivation layer.

20 Claims, 4 Drawing Sheets

(56) References Cited

U.S. PATENT DOCUMENTS

| | | | |
|---|---|---|---|
| 2007/0141737 | A1 | 6/2007 | Jacobs et al. |
| 2010/0258177 | A1 | 10/2010 | Ko et al. |
| 2011/0030778 | A1 | 2/2011 | Takacs et al. |
| 2011/0156043 | A1 | 6/2011 | Cho et al. |
| 2017/0213921 | A1 | 7/2017 | Yang et al. |
| 2020/0258177 | A1 | 8/2020 | Molinsky |

FOREIGN PATENT DOCUMENTS

| | | |
|---|---|---|
| CN | 102969367 | 3/2013 |
| CN | 103296094 | 9/2013 |
| CN | 103904168 | 7/2014 |
| CN | 104037243 | 9/2014 |
| CN | 204315578 | 5/2015 |
| CN | 105845747 | 8/2016 |
| CN | 109119493 | 1/2019 |
| CN | 109786477 | 5/2019 |
| CN | 110459615 | 11/2019 |
| CN | 110473921 | 11/2019 |
| CN | 110491949 | 11/2019 |
| CN | 210092098 | 2/2020 |
| CN | 111029415 | 4/2020 |
| CN | 111081823 | 4/2020 |
| CN | 111139448 | 5/2020 |
| CN | 111668318 | 9/2020 |
| JP | 2013-508998 | 3/2013 |
| JP | 2014-175660 | 9/2014 |
| KR | 20150002517 | 1/2015 |

OTHER PUBLICATIONS

Johannes Seiffe et al., "Surface passivation of crystalline silicon by plasma-enhanced chemical vapor deposition double layers of silicon-rich silicon oxynitride and silicon nitride", Journal of Applied Physics, 2011, vol. 109, pp. 034105-1-034105-12.
Y. Lv et al., "Towards high-efficiency industrial p-type mono-like Si PERC solar cells", Solar Energy Materials & Solar Cells, Oct. 7, 2019, vol. 204, pp. 110202-1-pp. 110202-9.
Xucmci Cheng et al., "Electronic Properties of a-SiOxNy:H/SiNx Stacks for Surface Passivation of P-Type Crystalline Si Wafers", IEEE Journal of Photovoltaics, 2016, vol. 6, pp. 1103-1108.
Japanese Office Action for App. No. 2020-103379, dated Sep. 8, 2020.
Japanese Notice of Allowance for App. No. 2020-103379, dated Oct. 9, 2020.
Hallam et al., "Effect of PECVD silicon oxynitride film composition on the surface passivation of silicon wafers", Solar Energy Materials & Solar Cells, vol. 96, pp. 173-179 (2012).
Therese Sorheim Stokkan et al., "Enhanced Surface Passivation of Predictable Quantum Efficient Detectors by Silicon Nitride and Silicon Oxynitride/Silicon Nitride Stack", Journal of Applied Physics, American Institute of Physics, vol. 124, No. 21, Dec. 3, 2018, pp. 1-6.
European Search Report (Application No. 22176670.2) dated Aug. 9, 2022. (8 pages).
Australia Office Action (Application No. 2021201475) dated Mar. 3, 2022 (4 pages).
Bret Hallam et al., "Solar Energy Materials & Solar Cells" SciVerse ScienceDirect, 96, (2012), pp. 173-179.
Australian Examination Report in AU App. No. 2020203989, dated Dec. 1, 2020.
Chinese Notice of Allowance in CN App. No. 202010477787.6, dated Sep. 3, 2021.
Chinese Office Action in CN App. No. 202010477787.6, dated Jul. 21, 2021.
European Search Report in EP App. No. 20179977.2, dated Sep. 14, 2020.
Anishkumar Soman et al., "Broad range refractive index engineering of $Si_xN_y$ and $SiO_xN_y$ thin films and exploring their potential applications in crystalline silicon solar cells", Materials Chemistry and Physics, 197, 2017, pp. 181-191.
Chen et al., "Industrially PERC Solar Cells with Integrated Front-Side Optimization", 2018, IEEE, pp. 0980-0982.
Seiffe et al., "Surface passivation of crystalline silicon by plasma-enhanced chemical vapor deposition double layers of silicon-rich silicon oxynitride and silicon nitride", Journal of Applied Physics, 109, 2011, pp. 034105-1-034105-12.
Japanese Decision to Grant a Patent Application No. 2020-103379, dated Oct. 1, 2020, (5 pages).
Japanese Decision to Grant a Patent Application No. 2020-186098, dated Oct. 18, 2021, (6 pages).
Japanese Notice of Reasons for Refusal Application No. 2020-103379, dated Sep. 1, 2020, (5 pages).
Cheng et al., "Electronic Properties of a-$SiO_xN_y$:H/$SiN_x$ Stacks for Surface Passivation of P-Type Crystalline Si Wafers", IEEE Journal of Photovoltaics, vol. 6, No. 5, Sep. 2016. pp. 1103-1108.
Thomson et al., "Graded Silicon Nitride Films: Optics and Passivation", J. Vac. Sci. Technol. A, vol. 33, No. 6, Nov./Dec. 2015, pp. 060610-1-060610-5.
Lv et al., "Towards high-efficiency industrial p-type mono-like Si PERC solar cells", Solar Energy Materials and Solar Cells, Oct. 7, 2019, vol. 204, (2020), pp. 110202-1-110202-9.
Japanese Office Action (Application No. 2020-186098) dated Jul. 14, 2021. (10 pages).

PHOTOVOLTAIC MODULE, SOLAR CELL, AND METHOD FOR PRODUCING SOLAR CELL

CROSS-REFERENCE TO RELATED APPLICATIONS

This application is a continuation of U.S. patent application Ser. No. 16/901,143, filed on Jun. 15, 2020, and issued as U.S. Pat. No. 10,991,838 on Apr. 27, 2021, which claims priority to Chinese Patent Application No. 202010477787.6, filed on May 29, 2020. All of the afore-mentioned patent applications are hereby incorporated by reference in their entireties.

TECHNICAL FIELD

The present disclosure relates to the field of solar cells, and in particular to a photovoltaic module, a solar cell, and a method for producing the solar cell.

BACKGROUND

Currently, an efficiency of a passivated emitter and rear Cell (PERC) can be effectively improved by means of enhancing back passivation characteristics. The existing PERC cells adopt an aluminum oxide/silicon nitride (AlOx/SiNx) stack as the back passivation layer. An aluminum oxide film contains a high fixed negative charge density, and a large number of fixed negative charges may shield electrons on a silicon surface, thereby reducing electrons that can be used for recombination and thus achieving a purpose of suppressing carrier recombination on the surface. Due to the high fixed negative charge density, a strong field passivation effect may be generated, and the aluminum oxide film is therefore considered as a field effect passivation film. Such dielectric film has a good passivation effect on both p-type and n-type substrate surfaces, but resulting in a high equipment cost and a low production capacity and output, which is not conducive to modern industrial mass production.

In addition, potential induced degradation (PID) has a negative impact on the service life and performance of solar cells. A main reason for the potential induced degradation lies in that Na+ ions inside glass of an encapsulating material of the photovoltaic (PV) module migrate to inside of the solar cell along a direction of the solar cell to destroy a p-n junction, leading to an attenuation of the power of the PV module and the reduction of reliability. The PERC cell including the aluminum oxide/silicon nitride stack passivation film is encapsulated by EVA (ethylene-vinyl acetate) into a bifacial photovoltaic module, which involves obvious PID phenomena for its front and back surfaces. The PID phenomenon of the front surface of the photovoltaic module may be alleviated by changing the encapsulating material into a higher-priced polyolefin (POE), but the PID phenomenon of the back surface still exists.

Therefore, it is desirable to develop a solar cell and a method for making the solar cell, which can enhance back passivation characteristics of the solar cell, reduce the PID and the manufacturing costs related to the solar cell.

SUMMARY

In one aspect of the present disclosure, a solar cell may be provided. The solar cell includes a semiconductor layer and a passivation film stack provided on a back surface of the semiconductor layer. The passivation film stack includes a first passivation layer provided on the back surface of the semiconductor layer and including a silicon-rich layer with a silicon atom concentration ranging from $5 \times 10^{21}/cm^3$ to $2.5 \times 10^{22}/cm^3$; a second passivation layer provided on a surface of the first passivation layer and including an oxygen-rich and nitrogen-rich layer; and a third passivation layer provided on a surface of the second passivation layer and including at least one silicon nitride film with a gradient-varied refractive index. A first refractive index of the first passivation layer is greater than a second refractive index of the second passivation layer and smaller than a third refractive index of the third passivation layer.

In some embodiments, the first passivation layer may include at least one of a silicon-rich silicon oxynitride film layer, a silicon-rich silicon oxycarbide film layer, or a silicon-rich silicon oxynitride carbide film layer.

In some embodiments, the second passivation layer may include an oxygen-rich and nitrogen-rich silicon oxynitride film layer or an oxygen-rich and nitrogen-rich silicon oxynitride carbide film layer.

In some embodiments, the first refractive index ranges from 1.69 to 1.90.

In some embodiments, the second refractive index ranges from 1.5 to 1.8.

In some embodiments, the third refractive index ranges from 2.02 to 2.12.

In some embodiments, the first passivation layer has a thickness ranging from 30 nm to 60 nm.

In some embodiments, the second passivation layer has a thickness ranging from 60 nm to 90 nm.

In some embodiments, the third passivation layer has a thickness ranging from 60 nm to 100 nm.

In another aspect of the present disclosure, a photovoltaic module may be provided. The photovoltaic module may include at least one solar cell configured to convert received light energy into electrical energy. Each of the at least one solar cell may include a semiconductor layer and a passivation film stack provided on a back surface of the semiconductor layer. The passivation film stack may include a first passivation layer provided on the back surface of the semiconductor layer and including a silicon-rich layer with a silicon atom concentration ranging from $5 \times 10^{21}/cm^3$ to $2.5 \times 10^{22}/cm^3$; a second passivation layer provided on a surface of the first passivation layer and including an oxygen-rich and nitrogen-rich layer; and a third passivation layer provided on a surface of the second passivation layer and including at least one silicon nitride film with a gradient-varied refractive index. A first refractive index of the first passivation layer is greater than a second refractive index of the second passivation layer and smaller than a third refractive index of the third passivation layer.

In another aspect of the present disclosure, a method for producing a solar cell may be provided. The method includes: sequentially depositing a first passivation layer, a second passivation layer, and a third passivation layer on a back surface of a semiconductor layer to form a passivation film stack. The first passivation layer may include a silicon-rich layer with a silicon atom concentration ranging from $5 \times 10^{21}/cm^3$ to $2.5 \times 10^{22}/cm^3$. The second passivation layer may include an oxygen-rich and nitrogen-rich layer. The third passivation layer may include at least one silicon nitride film with a gradient-varied refractive index. A first refractive index of the first passivation layer is greater than a second refractive index of the second passivation layer and smaller than a third refractive index of the third passivation layer.

In some embodiments, the first passivation layer may be deposited with reactants including silane ($SiH_4$), ammonia ($NH_3$), nitrous oxide ($N_2O$), and nitrogen ($N_2$), wherein a flow ratio of $SiH_4$ to ($NH_3+N_2O$) ranges from 1:15 to 1:19, and a flow ratio of $NH_3$ to $N_2O$ ranges from 1:3 to 1:6. The second passivation layer may be deposited with reactants including silane ($SiH_4$), ammonia ($NH_3$), nitrous oxide ($N_2O$), and nitrogen ($N_2$), wherein a flow ratio of $SiH_4$ to ($NH_3+N_2O$) ranges from 1:13 to 1:17, and a flow ratio of NH to $N_2O$ ranges from 1:8 to 1:12. The third passivation layer may be deposited with reactants including silane ($SiH_4$), ammonia ($NH_3$), and nitrogen ($N_2$), wherein a flow ratio of $SiH_4$ to $NH_3$ ranges from 1:5 to 1:10.

Compared with the solar cell that is passivated with a conventional passivation layer including $Al_2O_3$, the use of passivation film without $Al_2O_3$ can effectively enhance back passivation characteristics of the solar cell, reduce the PID of the photovoltaic module, and lower manufacturing costs.

DESCRIPTION OF EMBODIMENTS

The embodiments of the present disclosure will be described below in conjunction with the drawings. It should be noted that the embodiments involved in this description are not exhaustive and do not represent the exclusive embodiments of the present disclosure. The following corresponding examples are only for clearly illustrating the present disclosure content of the present disclosure, and are not intended to limit the embodiments of the present disclosure. For those of ordinary skill in the art, various changes and modifications can be made on the basis of the description of these embodiments, and any obvious changes or modifications that belong to the technical concept and invention content of the present disclosure shall fall in the protection scope of the present disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this disclosure, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

Figure 1:
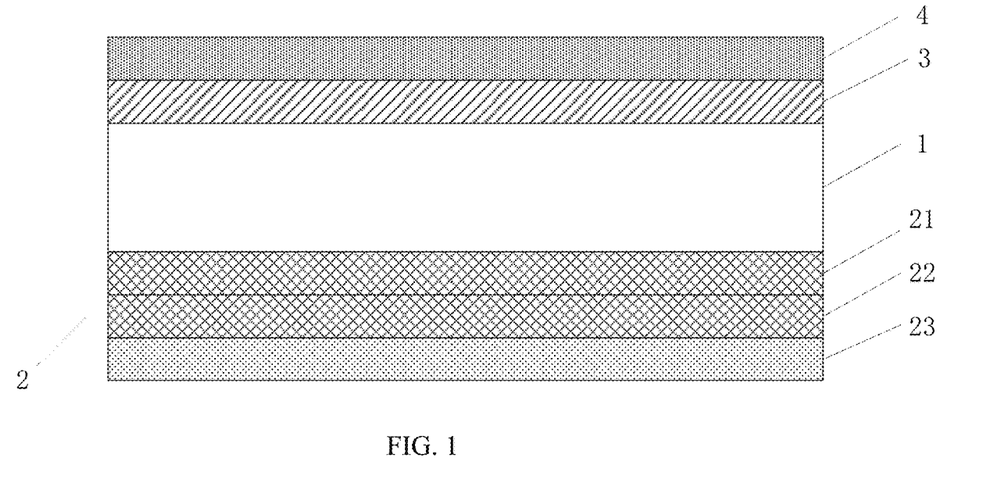
FIG. 1 is a schematic diagram illustrating an exemplary solar cell according to some embodiments of the present disclosure.

FIG. 1 is a schematic diagram illustrating an exemplary solar cell according to some embodiments of the present disclosure. As shown in FIG. 1, a solar cell at least includes a semiconductor layer 1 and a passivation film stack 2 disposed on a back surface of the semiconductor layer 1. In some embodiments, the semiconductor layer 1 may include a silicon substrate. Exemplary silicon substrates may include but not limited to a monocrystalline silicon substrate or a polycrystalline silicon substrate. For example, the semiconductor layer 1 may include a monocrystalline silicon substrate. The passivation film stack 2 includes two or more passivation layers. In some embodiments, the passivation film stack 2 includes a first passivation layer 21, a second passivation layer 22, and a third passivation layer 23. In a direction extending outwards from the back surface of the semiconductor layer 1, the first passivation layer 21 is located on the back surface of the semiconductor layer 1, the second passivation layer 22 is located on a surface of the first passivation layer 21, and the third passivation layer 23 is located on a surface of the second passivation layer 22. In some embodiments, there may be various sequences for respective layers of the passivation film stack 2, which shall not be limited to the sequence shown in FIG. 1.

Alternatively or additionally, at least one silicon oxide layer (not shown in FIG. 1) may be formed between the first passivation layer 21 and the semiconductor layer 1. In some embodiments, a thickness of the at least one silicon oxide layer may be in a range from 1 nm to 10 nm. For example, a preferable thickness of the at least one silicon oxide layer may be in the range from 1 nm to 3 nm. In some embodiments, the silicon oxide layer may be part of the first passivation layer 21. In some embodiments, the silicon oxide layer may be part of the semiconductor layer 1.

In some embodiments, respective layers of the passivation film stack 2 may be deposited by atomic layer deposition, chemical vapor deposition, plasma enhanced chemical vapor deposition, or physical deposition, etc.

In some embodiments, the first passivation layer 21 includes a silicon-rich layer, which has a silicon atom concentration ranging from $5\times10^{21}/cm^3$ to $2.5\times10^{22}/cm^3$. For example, exemplary silicon-rich layer may include at least one of a silicon oxynitride (SiOxNy) film layer, a silicon oxycarbide (SiOxCy) film layer or a silicon oxynitride carbide (SiOxNyCz) film layer. The first passivation layer 21 may be prepared by various means, such as chemical vapor deposition, plasma enhanced chemical vapor deposition, atomic layer deposition, constant pressure chemical vapor deposition, low pressure chemical vapor deposition, or the like.

Characteristics of high lattice matching between the silicon-rich layer and the semiconductor layer 1 (e.g., the silicon substrate) may be used to passivate dangling bonds of the semiconductor layer 1 by depositing the first passivation layer 21 on the semiconductor layer 1. Moreover, since the passivation layer prepared by deposition (for example, chemical vapor deposition, atomic layer deposition, plasma enhanced chemical vapor deposition, etc.) is amorphous, it is unavoidable that some lattice dislocations and resulting defect centers exist. To resolve this issue, a gas containing hydrogen, such as ammonia ($NH_3$), water vapor ($H_2O$), silane ($SiH_4$) and so on, may be used as a raw material for depositing the first passivation layer 21.

Since the silicon atoms are rich in the first passivation layer 21, a first refractive index of the first passivation layer 21 is a relatively high. In some embodiments, the first refractive index may be in a range from 1.69 to 1.90. In some embodiments, the first refractive index may be in a range from 1.69 to 1.75. In some embodiments, the first refractive index may be in a range from 1.75 to 1.90. Merely for illustration, the first passivation layer 21 may be prepared by depositing a first silicon oxynitride film, whose refractive index ranges from 1.71 to 1.75.

The first passivation layer 21 can not have a relatively large thickness, otherwise, an optical effect of the whole passivation film (e.g., the passivation film stack 2) of the solar cell may be affected. In some embodiments, a silicon-rich and hydrogen-rich film layer having a thickness not exceeding 100 nm may be used as the first passivation layer 21. For example, the thickness of the first passivation layer 21 may be in a range from 30 nm to 60 nm.

In some embodiments, the second passivation layer 22 may include an oxygen-rich and nitrogen-rich film layer. For example, the second passivation layer 22 may include an oxygen-rich and nitrogen-rich silicon oxynitride film layer or silicon oxynitride carbide film layer. In some embodiments, the oxygen-rich and nitrogen-rich passivation layer may be prepared by adjusting a nitrogen-oxygen ratio (N:O) of the hydrogen-rich and silicon-rich silicon oxynitride film layer or silicon oxynitride carbide film layer. The concentrations of oxygen atoms and nitrogen atoms are relatively high.

The oxygen-rich and nitrogen-rich film layer can prevent the hydrogen in the first passivation layer 21 from overflowing during a high-temperature treatment, so as to optimize the passivation effect. Moreover, the oxygen-rich and nitrogen-rich film layer may have a better weather resistance, a more stable passivation performance when a voltage is applied, such as in a PID testing environment.

Oxygen and nitrogen are rich in the second passivation layer 22, the higher oxygen content may reduce a corrosion resistance of the passivation layer. Therefore, in order to ensure the density and corrosion resistant of the whole passivation film stack, the second passivation layer 22 may not be designed to have a large thickness. For example, the oxygen-rich and nitrogen-rich film layer having a thickness not exceeding 110 nm can be used as the second passivation layer 22. As another example, the thickness of the second passivation layer 22 ranges from 60 nm to 90 nm. As a further example, the thickness of the second passivation layer 22 is 70 nm.

In some embodiments, the second passivation layer 22 may include an oxygen-rich and hydrogen-rich film layer, its refractive index (i.e., a second refractive index) is slightly lower than that of the first passivation layer 21. In some embodiments, the second refractive index of the second passivation layer 22 ranges from 1.5 to 1.8. For example, the second refractive index of the second passivation layer 22 ranges from 1.5 to 1.61. As another example, the second refractive index of the second passivation layer 22 ranges from 1.61 to 1.68. As a further example, the second refractive index of the second passivation layer 22 ranges from 1.68 to 1.8. As still an example, the second refractive index of the second passivation layer 22 is 1.7.

In some embodiments, the third passivation layer 23 includes at least one silicon nitride film with gradient-varied refractive index. As used herein, a refractive index of the third passivation layer 23 may be represented as a third refractive index. For example, the third passivation layer 23 may include a plurality of silicon nitride films, and the refractive indexes of the silicon nitride films may be different and gradient-varied. The silicon nitride film may have a good compactness and strong weather resistance. After being sintered at high temperature, the silicon nitride film may have a stronger compactness and corrosion resistance, which can prevent a metal paste from damaging the first and second passivation films formed on the surface of the semiconductor layer 1. Further, the PID of a photovoltaic module using the solar cell may be reduced.

In some embodiments, the third passivation layer 23 may be composed of a first silicon nitride film, a second silicon nitride film and a third silicon nitride film. These three silicon nitride films may have a respective refractive index. For example, a first refractive index of the first silicon nitride film is 2.02, a second refractive index of the second silicon nitride film is 2.03, and a third refractive index of the third silicon nitride film is 2.04. The refractive indexes of the first, second and third silicon nitride films are gradient-varied.

In some embodiments, the plurality of silicon nitride films may be designated as a whole silicon nitride layer (e.g., a silicon nitride stack). The refractive index of the whole silicon nitride layer is in a range from 2.02 to 2.12. In some embodiments, at least a portion of the plurality of silicon nitride films may have different silicon-to-nitrogen ratios (Si:N). For example, the farther away from the semiconductor layer one silicon nitride film is, the higher the nitride concentration of the silicon nitride film is, and the lower the refractive index of the silicon nitride film is. A better optical effect of the passivation film stack 2 may be achieved. In some embodiments, a thickness of the third passivation layer 23 is in a range from 60 nm to 100 nm. For example, a sum of thicknesses of the plurality of silicon nitride films is in the range from 60 nm to 100 nm.

In some embodiments, the third passivation layer 23 may be composed of one silicon nitride film. A refractive index of the silicon nitride film is in a range from 2.02 to 2.12. A thickness of the silicon nitride film is in a range from 60 nm to 100 nm.

In some embodiments, a sum of thicknesses of layers of the passivation film stack 2 is in a range from 160 nm to 260 nm. It can be understood that a thickness of each layer of the passivation film stack 2 can be adjusted in order to achieve a better back passivation effect, and will not intend to be limited herein. For achieving a better passivation performance, in the passivation film stack, the first refractive index of the first passivation layer is greater than the second refractive index of the second passivation layer and smaller than the third refractive index of the third passivation layer.

Referring back to FIG. 1, the solar cell further includes a diffusion layer 3 disposed on a front surface of the semiconductor layer 1. The diffusion layer 3 may be referred to as an emitter. The diffusion layer 3 may include a phosphorus-doped diffusion layer or a boron-doped diffusion layer. In some embodiments, for a P-type semiconductor layer, the diffusion layer 3 is a phosphorus-doped diffusion layer. In some embodiments, for an N-type semiconductor layer, the diffusion layer 3 is a boron-doped diffusion layer. A P-N junction between the diffusion layer 3 and the semiconductor layer 1 may be formed. In some embodiments, a thickness of the semiconductor layer 1 may be in a range from 160 μm to 220 μm.

Referring back to FIG. 1, an anti-reflection layer 4 is further provided on a surface of the diffusion layer 3. In some embodiments, the anti-reflection layer 4 may be a multi-layer film structure, including but not limited to an aluminum oxide film layer, a silicon nitride film layer, a silicon oxynitride film layer, or the like, or any combination thereof. In some embodiments, the anti-reflection layer 4 may include a film layer similar to or substantially the same as the passivation film stack 2. The anti-reflection layer 4 can not only reduce the reflection of light incident onto the solar cell, but also passivate the surface of the solar cell. In some embodiments, the anti-reflection layer 4 may be referred to as a front passivation layer.

It should be noted that the front surface of the semiconductor layer 1 described herein may refer to a surface facing the sun, that is, a light-receiving surface. In a normal operating mode, sunlight directly hits the light-receiving surface. The back surface of the semiconductor layer 1 is a surface opposite to the light-receiving surface.

In some embodiments, the semiconductor layer 1 may include but not limited to a monocrystalline silicon substrate or a polycrystalline silicon substrate. For example, the semiconductor layer 1 is a monocrystalline silicon substrate. In some embodiments, a resistivity of the semiconductor layer 1 may be in a range from 0.5 Ω·cm to 3.5 Ω·cm. In some embodiments, the resistivity may be in a range from 0.5 Ω·cm to 2.5 Ω·cm. In some embodiments, the resistivity may be in a range from 2.5 Ω·cm to 3.5 Ω·cm. Alternatively, the resistivity of the semiconductor layer 1 is 2.0 Ω·cm.

In some embodiments, at least one back electrode may be disposed on the back surface of the semiconductor layer 1 (not shown in FIG. 1). At least a portion of the at least one back electrode may be disposed on the surface of the passivation film stack 2, for example, disposed on the surface of the third passivation layer 23. The at least one back electrode may penetrate and/or partially penetrate through the passivation film stack 2 to form an ohmic contact with the semiconductor layer 1. For example, a conductive paste may be printed on the back surface of the semiconductor layer 1 by a screen printing technique, then be dried to form grid-shaped back electrodes. The conductive paste of the back electrodes may include a conductive silver paste with penetrability, which can penetrate through each layer of the passivation film stack 2 after being sintered to be electrically connected to the semiconductor layer 1.

In some embodiments, at least one front electrode may be disposed on the front surface of the semiconductor layer 1 (not shown in FIG. 1). At least a portion of the at least one front electrode may be disposed on the surface of the anti-reflection layer 4. Similar to the back electrodes, the at least one front electrode may be formed by the screen printing technique.

It can be understood that the passivation film stack structure illustrated in FIG. 1 can be used to prepare various solar cells, such as a PERC solar cell, an interdigitated back contact (IBC) solar cell, a silicon heterojunction (SHJ) solar cell, an interdigitated back contact and heterojunction (HBC) solar cell, a tunnel oxide passivation contact (TOP-Con) solar cell, a polysilicon oxide selective passivation contact (POLO) solar cell, etc.

In some embodiments, at least one solar cell with the passivation film stack 2 can be used to form a photovoltaic module. The photovoltaic module may include but not limited to a shingled photovoltaic module, a bifacial photovoltaic module, a multi-bus bar (MBB) photovoltaic module. For example, at least one cell string, which is composed of the at least one solar cell, may be provided. The at least one string may be operably connected via a conductive connection material, such as a conductive solder or a conductive adhesive. The lamination for the connected string may be operated with a back plate and an ethylene-vinyl acetate copolymer (EVA) in accordance with a certain sequence, then a frame may be installed to form the photovoltaic module. The at least one solar cell can be used to convert the received light energy to electrical energy. The photovoltaic module may further send the electrical energy to a load.

Compared with the solar cell that is passivated with a conventional passivation layer including $Al_2O_3$, the use of passivation film without $Al_2O_3$ can effectively enhance back passivation characteristics of the solar cell, reduce the PID of the photovoltaic module, and lower manufacturing costs.

Figure 2:
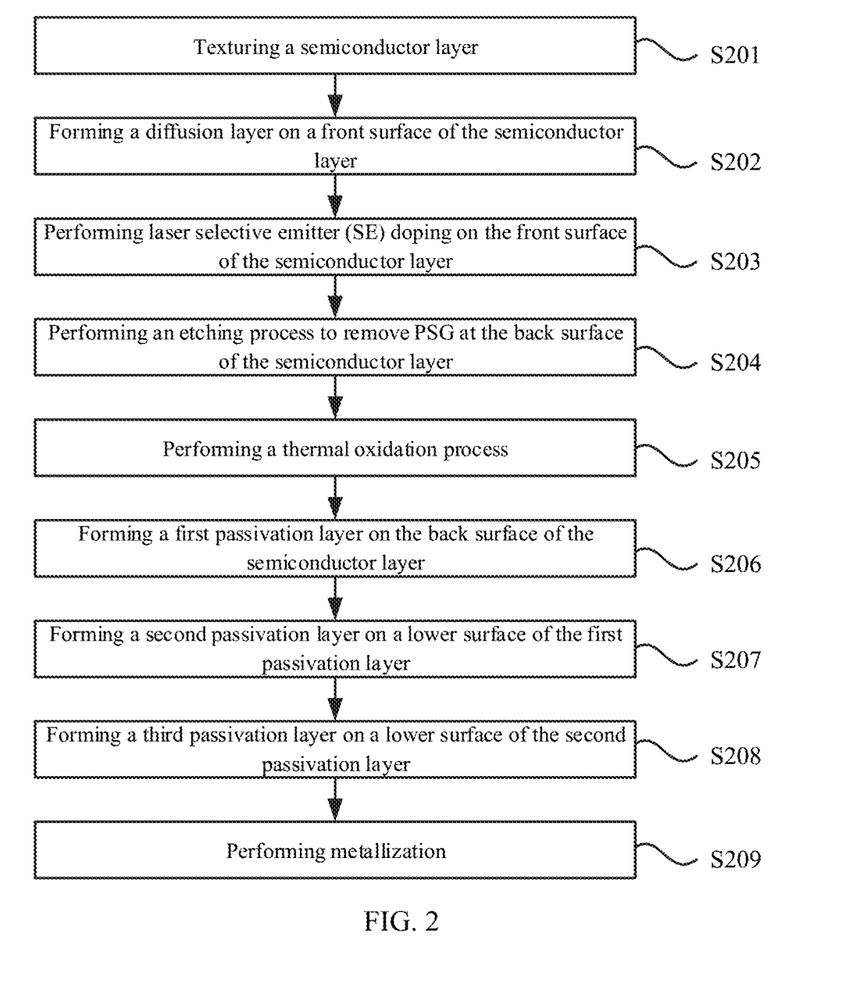
FIG. 2 is a flowchart illustrating an exemplary process for producing a solar cell according to some embodiments of the present disclosure.

FIG. 2 is a flowchart illustrating an exemplary process for producing a solar cell according to an embodiment of the present disclosure. For example, the solar cell with the passivation film stack 2 illustrated in FIG. 1 may be produced.

At S201, the semiconductor layer (e.g., the semiconductor layer 1 illustrated in FIG. 1) may be textured.

For example, the semiconductor layer 1 may be textured by a wet texturing process. In some embodiments, when the semiconductor layer includes a monocrystalline silicon, an alkaline solution, such as a potassium hydroxide solution, may be used for the texturing. In some embodiments, when the semiconductor layer includes polysilicon, an acid solution, such as a hydrofluoric acid solution, may be used for the texturing.

After the texturing, the surface (e.g., the front surface) of the semiconductor layer may have a textured structure. The exemplary textured structure may be a pyramid structure which have a light trapping effect, so as to increase the absorption of light incident onto the solar cell, thereby improving the efficiency of the solar cell.

In some embodiments, the semiconductor layer may be cleaned (e.g., through an ultrasonic cleaning) before the texturing, so as to remove impurities, such as metal and organic contaminants on the surface(s) of the semiconductor layer.

At S202, a diffusion layer may be formed on a front surface of the semiconductor layer (e.g., a light-receiving surface of the semiconductor layer 1).

Figure 3:
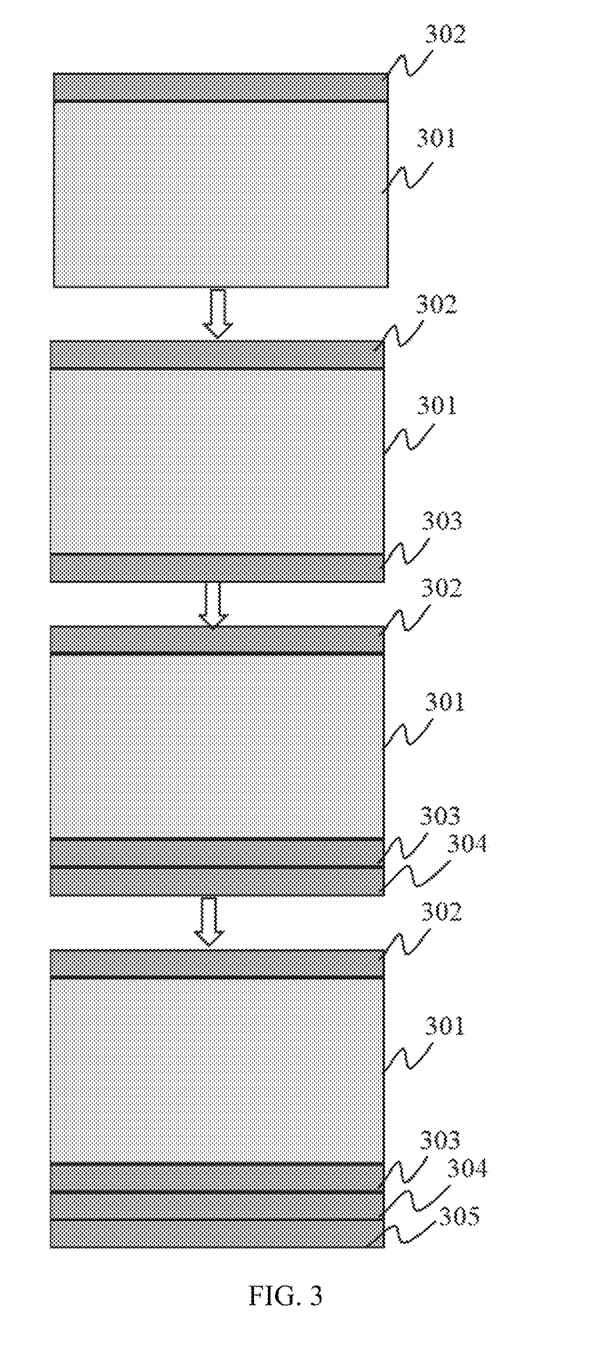
FIG. 3 is a schematic diagram illustrating an exemplary process for producing a solar cell according to some embodiments of the present disclosure.

Referring to FIG. 3, a diffusion layer 302 is formed on the semiconductor layer 301. The semiconductor layer 301 may be similar to or same as the semiconductor layer 1 illustrated in FIG. 1. In some embodiments, the diffusion layer 302 may include but not limited to a phosphorus-doped diffusion layer, a boron-doped diffusion layer. For example, when the diffusion layer 302 is the phosphorus-doped diffusion layer, a sheet resistance of the diffusion layer 302 ranges from 140Ω to 150Ω.

Merely for illustration, the semiconductor layer 301 may be placed in a tube-type diffusion furnace, phosphorus oxychloride is used as a dopant source, and a diffusion temperature is set at about 850° C. In the diffusion conditions, the phosphorus-doped diffusion layer 302 may be formed and its sheet resistance ranges from 140Ω to 150Ω.

At S203, a laser selective emitter (SE) doping may be performed on the front surface of the semiconductor layer to form a lightly doped region and a heavily doped region. In some embodiments, the operation 203 can be omitted.

At S204, an etching process may be performed. The semiconductor layer may be etched using hydrofluoric acid in order to remove phosphorus silicon glass (PSG).

At S205, an oxidation process (e.g., thermal oxidation) may be performed. The thermal oxidation may be used to improve the passivation for the solar cell. In some embodiments, at least one silicon oxide layer may be deposited on the surface(s) of the semiconductor layer through the thermal oxidation process. In some embodiments, a thickness of the at least one silicon oxide layer may be in a range from 1 nm to 10 nm. For example, a preferable thickness of the at least one silicon oxide layer may be in the range from 1 nm to 3 nm.

The passivation process be performed by at least one of plasma enhanced chemical vapor deposition (PECVD), atomic layer deposition (ALD), chemical vapor deposition (CVD) and physical vapor deposition (PVD), or the like.

In some embodiments, the passivation film stack on the back surface of the semiconductor layer may be formed in accordance with operations S206-S208.

At S206, a first passivation layer may be formed on the back surface of the semiconductor layer. In some embodiments, the first passivation layer may be disposed on the surface of the silicon oxide layer. In some embodiments, the silicon oxide layer may be part of the first passivation layer.

Referring to FIG. 3, a first passivation layer 303 is prepared on the back surface of the semiconductor layer 301. In some embodiments, the first passivation layer 303 is prepared by PECVD in accordance with first preparation conditions. The first preparation conditions may include reactants, at least one flow ratio between the reactants, a power for the preparation, a pressure for the preparation, and/or a deposition temperature for the preparation. Specifically, the reactants include silane ($SiH_4$), ammonia ($NH_3$), nitrous oxide ($N_2O$), and nitrogen ($N_2$). The flow ratio of $SiH_4$ to ($NH_3+N_2O$) ranges from 1:15 to 1:19, and the flow ratio of $NH_3$ to $N_2O$ ranges from 1:3 to 1:6. The power ranges from 8000 W to 10000 W. The pressure ranges from 1150 Pa to 1450 Pa. The deposition temperature ranges from 460° C. to 540° C.

In some embodiments, under the preparation conditions, the prepared first passivation layer 303 may include a silicon-rich layer. A silicon atom concentration of the first passivation layer 303 may be in a range from $5\times10^{21}/cm^3$ to $2.5\times10^{22}/cm^3$. The first passivation layer 302 may include a silicon oxynitride layer.

Since the silicon atoms are rich in the first passivation layer 21, a refractive index of the first passivation layer 21 is a relatively high. In some embodiments, the refractive index may be in a range from 1.69 to 1.90. In some embodiments, the refractive index may be in a range from 1.69 to 1.75. In some embodiments, the refractive index may be in a range from 1.75 to 1.90. Merely for illustration, the first passivation layer 303 (or the first passivation layer 21) may be prepared by depositing a first silicon oxynitride film, whose refractive index ranges from 1.71 to 1.75.

In some embodiments, the first passivation layer 303 (or the first passivation layer 21) can not have a relatively large thickness, otherwise, an optical effect of the whole passivation film (e.g., the passivation film stack 2) of the solar cell may be affected. In some embodiments, a silicon-rich and hydrogen-rich film layer having a thickness not exceeding 100 nm may be used as the first passivation layer 303. For example, the thickness of the first passivation layer 21 may be in a range from 30 nm to 60 nm.

At S207, a second passivation layer may be formed on a lower surface of the first passivation layer.

Referring to FIG. 3, a second passivation layer 304 is formed on the surface of the first passivation layer 303. In some embodiments, the second passivation layer 304 (or the second passivation layer 22) is prepared by PECVD in accordance with second preparation conditions. The second preparation conditions may include second reactants, at least one second flow ratio between the second reactants, a second power for the preparation, a second pressure for the preparation, and/or a second deposition temperature for the preparation. Specifically, the second reactants may include silane ($SiH_4$), ammonia ($NH_3$), nitrous oxide ($N_2O$), and nitrogen ($N_2$). The second ratio of $SiH_4$ to ($NH_3+N_2O$) ranges from 1:13 to 1:17, and the second flow ratio of $NH_3$ to $N_2O$ ranges from 1:8 to 1:12. The second power ranges from 8000 W to 10000 W. The second pressure ranges from 1050 Pa to 1350 Pa. The second deposition temperature ranges from 460° C. to 520° C.

In some embodiments, the prepared second passivation layer 304 may include an oxygen-rich and nitrogen-rich layer. For example, the second passivation layer 304 may include a silicon oxynitride layer, while the second passivation layer 304 has a refractive index that is slightly lower than that of the first passivation layer 303. In some embodiments, the refractive index of the second passivation 304 may be in a range from 1.5 to 1.8. In some embodiments, the refractive index of the second passivation layer 304 may be in a range from 1.5 to 1.61. In some embodiments, the refractive index of the second passivation layer 304 may be in a range from 1.61 to 1.68. In some embodiments, the refractive index of the second passivation layer 304 may be in a range from 1.68 to 1.8. For example, the refractive index of the second passivation layer 304 is 1.7.

In order to ensure the density and corrosion resistant of the whole passivation film stack, the second passivation layer 304 may not be designed to have a large thickness. For example, the oxygen-rich and nitrogen-rich film layer having a thickness not exceeding 110 nm can be used as the second passivation layer 304. As another example, the thickness of the second passivation layer 304 ranges from 60 nm to 90 nm. As a further example, the thickness of the second passivation layer 304 is 70 nm.

At S208, a third passivation layer is formed on a lower surface of the second passivation layer. The third passivation layer may be considered as an outermost layer of the passivation film stack on the back surface of the semiconductor layer.

Referring to FIG. 3, a third passivation layer 305 is formed on a surface of the second passivation layer 304. For example, the third passivation layer 305 (or the third passivation layer 23) may include at least one silicon nitride film. In some embodiments, the third passivation layer 305 is prepared by PECVD in accordance with third preparation conditions. The third preparation conditions may include third reactants, at least one third flow ratio between the third reactants, a third power for the preparation, a third pressure for the preparation, and/or a third deposition temperature for the preparation. Specifically, the third reactants include silane ($SiH_4$), ammonia ($NH_3$) and nitrogen ($N_2$). The third flow ratio of $SiH_4$ to $NH_3$ ranges from 1:5 to 1:10. The third power ranges from 8000 W to 10000 W. The third pressure ranges from 1450 Pa to 1850 Pa. The third deposition temperature ranges from 460° C. to 520° C.

In some embodiments, under the preparation conditions, the prepared third passivation layer 305 may be include one silicon nitride film or a plurality of silicon nitride films.

For example, the third passivation layer 305 may include the plurality of silicon nitride films, and the refractive indexes of the silicon nitride films may be different and gradient-varied. The silicon nitride film may have a good compactness and strong weather resistance. After being sintered at high temperature, the silicon nitride films may have a stronger compactness and corrosion resistance, which can prevent a metal paste from damaging the first and second passivation films formed on the surface of the semiconductor layer. Further, the PID of a photovoltaic module using the solar cell may be reduced. In some embodiments, the plurality of silicon nitride films may be designated as a whole silicon nitride layer (e.g., a silicon nitride stack). The refractive index of the whole silicon nitride layer is in a range from 2.02 to 2.12. In some embodiments, at least a portion of the plurality of silicon nitride films may have different silicon-to-nitrogen ratios (Si:N). For example, the farther away from the semiconductor layer one silicon nitride film is, the higher the nitride concentration of the silicon nitride film is, and the lower the refractive index of the silicon nitride film is. A better optical effect of the passivation film stack may be achieved. In some embodiments, a thickness of the third passivation layer 305 is in a range from 60 nm to 100 nm. For example, a sum of thicknesses of the plurality of silicon nitride films is in the range from 60 nm to 100 nm.

As another example, the third passivation layer 305 may be composed of one silicon nitride film. A refractive index of the silicon nitride film is in a range from 2.02 to 2.12. A thickness of the silicon nitride film is in a range from 60 nm to 100 nm.

At S209, metallization may be performed on a silicon wafer after being processed in operations S208. Herein the silicon wafer at least includes the prepared passivation layers and the semiconductor layer. During the S209, at least one portion of the prepared passivation layers may be removed to form a metallization region, for example, through a laser grooving technique. At least one electrode may be formed using screen printing technique. For example, front and back electrodes of the solar cell may be formed.

Figure 4:
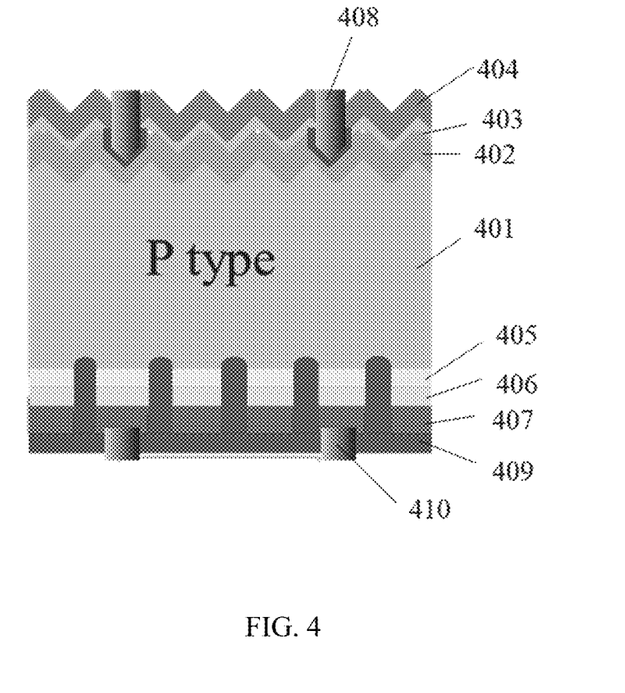
FIG. 4 is a schematic diagram illustrating an exemplary solar cell according to some embodiments of the present disclosure.

FIG. 4 is a schematic diagram illustrating an exemplary solar cell according to an embodiment of the present disclosure.

As shown in FIG. 4, the solar cell 400 may be a P-type PERC cell. The solar cell 400 includes a P-type semiconductor layer 401, a phosphorus-doped diffusion layer 402, an anti-reflection/passivation layer (including a silicon oxide layer 403 and a silicon nitride layer 404) on the front surface of the semiconductor layer 401, a first passivation layer 405, a second passivation layer 406, a third passivation layer 407, a front surface electrode 408, a back electrode 409, and a bus bar 410. The first, second and third passivation layers are sequentially arranged outwards from the back surface of the semiconductor layer 401.

In some embodiments, the first passivation layer 405 includes a silicon-rich layer with a silicon atom concentration ranging from $5 \times 10^{21}/cm^3$ to $2.5 \times 10^{22}/cm^3$. The first passivation layer 405 may include at least one of a silicon-rich silicon oxynitride film layer, a silicon-rich silicon oxycarbide film layer, or a silicon-rich silicon oxynitride carbide film layer. The refractive index of first passivation layer 405 may in a range from 1.69 to 1.90, and the thickness of first passivation layer 405 may be in a range from 30 nm to 60 nm.

In some embodiments, the second passivation layer 406 includes an oxygen-rich and nitrogen-rich silicon oxynitride film layer. The second passivation layer 406 may include an oxygen-rich and nitrogen-rich silicon oxynitride film layer or an oxygen-rich and nitrogen-rich silicon oxynitride carbide film layer. The refractive index of the second passivation layer 406 may be in a range from 1.5 to 1.8, and the thickness of the second passivation layer 406 may be in a range from 60 nm to 90 nm.

In some embodiments, the third passivation layer 407 includes at least one silicon nitride film layer with a gradient-varied refractive index. The refractive index of the third passivation layer 407 may be in a range from 2.02 to 2.12 and the thickness of the third passivation layer 407 may be in a range from 60 nm to 100 nm.

In some embodiments, the present disclosure provides a method for producing the solar cell 400. The method may include: providing a P-type semiconductor layer and having a resistivity ranging from 0.5 Ω·cm to 3.5 Ω·cm; processing the semiconductor layer with a wet chemical manner to form the silicon wafer with a textured structure; forming a PN junction by implanting dopants (e.g., N-type dopants); forming a selective emitter (SE) structure by processing the PN junction, and/or performing an edge isolation for the PN junction in order to enhance the PN junction; forming passivation film stacks on the front and back surfaces of the silicon wafer (e.g., the anti-reflection/passivation layers 402, 403 and 404 on the front surface, and the passivation layers 405, 406 and 407 on the back surface); performing a metallization step on the passivated silicon wafer to form electrodes for collecting current to be output; and performing post-processing on the silicon wafer, for example, light annealing, electric annealing, etc.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

What is claimed is:

1. A solar cell, comprising:
   a semiconductor layer having a resistivity ranging from 0.5 Ω·cm to 3.5 Ω·cm;
   a diffusion layer formed on a front surface of the semiconductor layer, wherein the diffusion layer and the semiconductor layer form a PN junction;
   a front passivation layer formed on the diffusion layer; and
   a passivation film stack provided on a back surface of the semiconductor layer,
   wherein the passivation film stack comprises at least one silicon oxynitride film layer and at least one silicon nitride film, a sum of thicknesses of layers of the passivation film stack is in a range from 160 nm to 260 nm, the at least one silicon oxynitride film layer has a thickness ranging from 90 nm to 150 nm, and the at least one silicon oxynitride film layer includes a silicon-rich silicon oxynitride film having a silicon atom concentration ranging from $5 \times 10^{21}/cm^3$ to $2.5 \times 10^{22}/cm^3$.

2. The solar cell according to claim 1, wherein the at least one silicon oxynitride film layer comprises an oxygen-rich and nitrogen-rich silicon oxynitride film layer.

3. The solar cell according to claim 1, wherein a refractive index of one of the at least one silicon oxynitride film layer is smaller than a refractive index of one of the at least one silicon nitride film.

4. The solar cell according to claim 1, wherein the at least one silicon nitride film layer is configured as a silicon nitride film stack, and a refractive index of the silicon nitride stack is in a range from 2.02 to 2.12.

5. The solar cell according to claim 4, wherein the silicon nitride stack comprises silicon nitride films having different silicon-to-nitrogen ratios (Si:N), and nitride concentrations of the silicon nitride films of the silicon nitride stack increase in a direction extending outwards from the semiconductor layer.

6. The solar cell according to claim 5, wherein refractive indexes of the silicon nitride films of the silicon nitride stack gradually changes in the direction extending outwards from the semiconductor layer.

7. The solar cell according to claim 6, wherein the refractive indexes of the silicon nitride films of the silicon nitride stack decreases in the direction extending outwards from the semiconductor layer.

8. The solar cell according to claim 1, wherein the semiconductor layer comprises a P-type substrate or an N-type substrate.

9. The solar cell according to claim 1, wherein the semiconductor layer has a thickness ranging from 160 μm to 220 μm.

10. The solar cell according to claim 1, comprising:
a front surface electrode and a back electrode that are electrically connected to the semiconductor layer.

11. The solar cell according to claim 1, wherein the solar cell is a PERC cell.

12. A photovoltaic module, comprising:
at least one solar cell configured to convert received light energy into electrical energy, wherein the at least one solar cell each comprises:
a semiconductor layer having a resistivity ranging from 0.5 Ω·cm to 3.5 Ω·cm;
a diffusion layer formed on a front surface of the semiconductor layer, wherein the diffusion layer and the semiconductor layer form a PN junction;
a front passivation layer formed on the diffusion layer; and
a passivation film stack provided on a back surface of the semiconductor layer,
wherein the passivation film stack comprises at least one silicon oxynitride film layer and at least one silicon nitride film, a sum of thicknesses of layers of the passivation film stack is in a range from 160 nm to 260 nm, the at least one silicon oxynitride film layer has a thickness ranging from 90 nm to 150 nm, and the at least one silicon oxynitride film layer includes a silicon-rich silicon oxynitride film having a silicon atom concentration ranging from $5\times10^{21}/cm^3$ to $2.5\times10^{22}/cm^3$.

13. The photovoltaic module according to claim 12, wherein the at least one silicon oxynitride film layer comprises an oxygen-rich and nitrogen-rich silicon oxynitride film layer.

14. The photovoltaic module according to claim 12, wherein a refractive index of one of the at least one silicon oxynitride film layer is smaller than a refractive index of one of the at least one silicon nitride film.

15. The photovoltaic module according to claim 12, wherein the at least one silicon nitride film layer is configured as a silicon nitride film stack, and a refractive index of the silicon nitride stack is in a range from 2.02 to 2.12.

16. The photovoltaic module according to claim 15, wherein the silicon nitride stack comprises silicon nitride films having different silicon-to-nitrogen ratios (Si:N), and nitride concentrations of the silicon nitride films of the silicon nitride stack increase in a direction extending outwards from the semiconductor layer.

17. The photovoltaic module according to claim 16, wherein refractive indexes of the silicon nitride films of the silicon nitride stack gradually changes in the direction extending outwards from the semiconductor layer.

18. The photovoltaic module according to claim 17, wherein the refractive indexes of the silicon nitride films of the silicon nitride stack decreases in the direction extending outwards from the semiconductor layer.

19. The photovoltaic module according to claim 12, wherein the semiconductor layer comprises a P-type substrate or an N-type substrate.

20. The photovoltaic module according to claim 12, wherein the semiconductor layer has a thickness ranging from 160 μm to 220 μm.

* * * * *